(12) United States Patent
Adachi

(10) Patent No.: US 9,947,725 B2
(45) Date of Patent: Apr. 17, 2018

(54) DISPLAY DEVICE

(71) Applicant: Japan Display Inc., Minato-ku (JP)

(72) Inventor: Masaya Adachi, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/480,799

(22) Filed: Apr. 6, 2017

(65) Prior Publication Data

US 2018/0012942 A1   Jan. 11, 2018

(30) Foreign Application Priority Data

Jul. 7, 2016 (JP) ................................. 2016-135144

(51) Int. Cl.
*H01L 31/00* (2006.01)
*H01L 21/00* (2006.01)
*H01L 27/32* (2006.01)

(52) U.S. Cl.
CPC ...... *H01L 27/3216* (2013.01); *H01L 27/3276* (2013.01); *H01L 2251/5315* (2013.01)

(58) Field of Classification Search
CPC ............. H01L 27/3216; H01L 27/3276; H01L 2251/5315
See application file for complete search history.

(56) References Cited

U.S. PATENT DOCUMENTS

| | | | |
|---|---|---|---|
| 2006/0103940 A1* | 5/2006 | Lo | G02F 1/133514 359/619 |
| 2007/0291054 A1 | 12/2007 | Shin et al. | |
| 2012/0286300 A1 | 11/2012 | Kijima | |
| 2014/0183479 A1* | 7/2014 | Park | H01L 51/56 257/40 |
| 2014/0307430 A1* | 10/2014 | Lo | G09F 13/00 362/231 |
| 2015/0054719 A1* | 2/2015 | Lee | G09G 3/3208 345/76 |
| 2016/0240811 A1* | 8/2016 | Kim | H01L 51/5234 |

FOREIGN PATENT DOCUMENTS

JP    2012-238544    12/2012

* cited by examiner

*Primary Examiner* — Su C Kim
(74) *Attorney, Agent, or Firm* — Oblon, McClelland, Maier & Neustadt, L.L.P.

(57) ABSTRACT

A plurality of pixels P and a plurality of light-transmitting regions L are alternately disposed such that a light-transmitting region M1 is disposed between two pixels closest to each other in a X-direction and a light-transmitting region M2 is disposed between two pixels closest to each other in a Y-direction. Each of the light-transmitting regions is divided into a plurality of divided regions by a plurality of wirings WX and a plurality of wirings WY. The divided regions include first regions and second regions that are different from each other in widths in at least one of the X-direction and the Y-direction.

18 Claims, 6 Drawing Sheets

DISPLAY DEVICE

CROSS-REFERENCE TO RELATED APPLICATION

The present application claims priority from Japanese application JP2016-135144 filed on Jul. 7, 2016, the content of which is hereby incorporated by reference into this application.

BACKGROUND OF THE INVENTION

1. Field of the Invention

The present invention relates to a display device.

2. Description of the Related Art

There has been known a so-called transparent display device that displays an image on a display area and has a structure allowing the object beyond the display area to be seen through. JP2012-238544A discloses a transparent display device in which adjacent three sub-pixels, including a red sub-pixel, a green sub-pixel, and a blue sub-pixel constitute one pixel, and the transparent display device has a transparent region (light-transmitting region) adjacent to the pixel (refer to FIG. 14(b) of JP2012-238544A).

In recent years, transparency of transparent display devices is expected to be enhanced.

SUMMARY OF THE INVENTION

One or more embodiments of the present invention have been conceived in view of the above, and an object thereof is to enhance transparency of a display device having a light-transmitting region.

A display device according to one aspect of the present invention includes a plurality of pixels each including light-emitting regions, colors of the light-emitting regions being different from each other, a plurality of light-transmitting regions; a plurality of first wirings extending in a first direction; and a plurality of second wirings extending in a second direction that intersects the first direction, wherein the pixels and the light-transmitting regions are alternately disposed such that at least one of the light-transmitting regions is disposed between two of the pixels which are adjacent to each other in the first direction and at least one of the light-transmitting regions is disposed between two of the pixels which are adjacent to each other in the second direction, each of the light-transmitting regions is divided into a plurality of divided regions by at least one of the first wirings and the second wirings, the divided regions include a first region with a first width and a second region with a second width which is a same direction of the first width, the same direction is one of the first and second direction, a value of the first width is different from a value of the second width.

The display device according to another aspect of the present invention includes a first pixel, a second pixel, and a third pixel, each including a plurality of sub-pixels, and a first light-transmitting region, a second light-transmitting region, and a third light-transmitting region through which light is transmitted, wherein the first pixel, the first light-transmitting region, and the second pixel are disposed in a first direction in this order, the second light-transmitting region, the third pixel, and the third light-transmitting region are disposed in the first direction in this order, the first pixel and the second light-transmitting region are disposed in a second direction that intersects a first direction, a plurality of wirings extending in the second direction, each of the first to third light-transmitting regions is divided into a plurality of divided regions including at least a first divided region and a second divided region by the wirings, the first divided region has a first width in the first direction, the second divided region has a second width in the first direction, and a value of the first width is different from a value of the second width.

The display device according to another aspect of the present invention includes a first pixel, a second pixel, and a third pixel, each including a plurality of sub-pixels, a first light-transmitting region, a second light-transmitting region, a third light-transmitting region, a fourth light-transmitting region, and a fifth light-transmitting region through which light is transmitted, a plurality of first wirings extending in a second direction t; and a plurality of second wirings extending in a first direction that intersects the second direction, wherein the first pixel, the first light-transmitting region, and the second pixel are disposed in the first direction in this order, the second light-transmitting region, the third pixel, and the third light-transmitting region are disposed in the first direction in this order, the first pixel and the second light-transmitting region are disposed in the second direction, the first light-transmitting region and the third pixel are disposed in the second direction, the second pixel and the third light-transmitting region are disposed in the second direction, the fourth light-transmitting region includes an area between the first pixel and the first light-transmitting region and an area between the second light-transmitting region and the third pixel and extends in the second direction, the fifth light-transmitting region includes an area between the second pixel and the first light-transmitting region and an area between the third light-transmitting region and the third pixel and extends in the second direction, each of the first to third light-transmitting regions is divided into a plurality of fourth divided regions by the first wirings, both the fourth light-transmitting region and the fifth light-transmitting region is divided into a plurality of fifth divided regions by the second wirings, one of the fourth divided region has a fourth width in the first direction, one of the fifth divided region has a fifth width in the first direction, and a value of the fourth width is different from a value of the fifth width.

DETAILED DESCRIPTION OF THE INVENTION

Embodiments of the present invention are described below with reference to the accompanying drawings. The disclosure herein is merely an example, and appropriate modifications coming within the spirit of the present invention, which are easily conceived by those skilled in the art, are intended to be included within the scope of the invention as a matter of course. In the accompanying drawings, widths, thicknesses, shapes, or other characteristics of each part are schematically illustrated compared to actual configurations for clarity of illustration. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Further, in the embodiments, when a positional relationship between a component and another component is defined, the words "on" and "below" suggest not only a case where the another component is disposed immediately on or below the component, but also a case where the component is disposed on or below the another component with a third component interposed therebetween.

Figure 1:
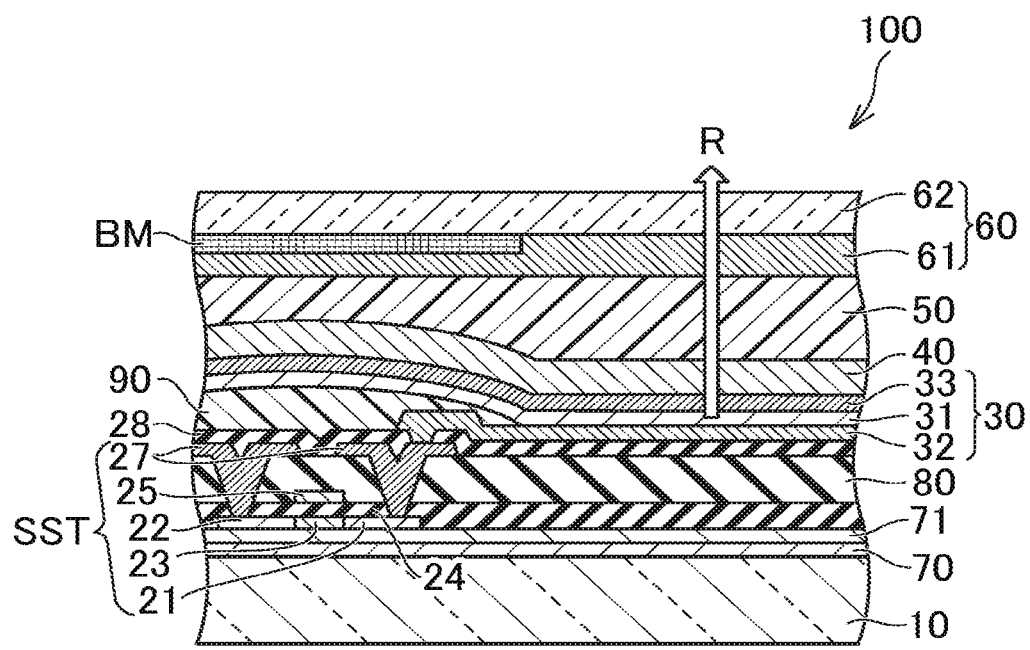
FIG. 1 is a schematic sectional view schematically illustrating a cross-sectional view of the display device around a pixel switch transistor according to the first embodiment.

FIG. 1 is a schematic sectional view schematically illustrating a cross-sectional view of the display device around a pixel switch transistor according to the first embodiment. A display device 100 is a so-called transparent display device that displays an image on a display area A (see FIG. 2), while allowing an object beyond the display device A to be seen through. The display device 100 is a so-called top-emitting display device that takes out light from an organic light-emitting diode 30 from a direction opposite to a substrate 10 (R-arrow direction in FIG. 1), and an active-driving type OLED (Organic Light Emitting Diode) display device.

As shown in FIG. 1, the display device 100 includes the substrate 10, a pixel switch transistor SST, the organic light-emitting diode 30, a seal 40, a filler 50, and a counter substrate 60, and has a structure in which these elements are laminated. In the first embodiment, the organic light-emitting diode 30 is used as a light emitting element, although a quantum dot light-emitting element may also be used as a light emitting element.

The pixel switch transistor SST includes a polysilicon layer, which includes source/drain regions 21, 22, and a channel region 23, a gate line layer 25, and source/drain electrodes 27. Further, a first insulating interlayer 24 is provided on the channel region 23, and a second insulating interlayer 28 is provided on the source/drain electrodes 27. A first base film 70 made of a material such as silicon nitride (SiNx) is disposed between the substrate 10 and the pixel switch transistor SST so that an ion, such as natrium and kalium, is not mixed into the channel region 23 and the gate line layer 25 from the substrate 10. A second base film 71 made of silicon oxide (SiOx) is disposed between the first base film 70 and the channel region 23. An insulating film 80 is provided on the second base film 71.

The organic light-emitting diode 30 includes an organic EL (Electro Luminescence) layer 31, a lower electrode 32 provided below the organic EL layer 31, and an upper electrode 33 provided on the organic EL layer 31. One of the lower electrode 32 and the upper electrode 33 functions as an anode, and the other functions as a cathode.

The organic EL layer 31 covers a light-emitting region of the lower electrode 32, and is connected to one of the source/drain electrodes 27 through a hole penetrating the second insulating interlayer 28. A third insulating interlayer (bank) 90 is formed in a non-light emitting region so as to separate the organic EL layer 31 from the lower electrode 32. The upper electrode 33 is provided so as to cover the entire organic EL layer 31.

Here, the configuration of the organic EL layer 31 will be discussed. The configuration of the organic EL layer 31 is well known technology, and thus, is simplified in FIG. 1. The organic EL layer 31 is configured by stacking an electron transport layer, alight emitting layer, and a hole transport layer, from the cathode side to the anode side in this order. A hole injection layer and a hole blocking layer may be disposed between the anode and the light emitting layer in addition to the hole transport layer.

Further, an electron injection layer or an electron blocking layer may be disposed between the cathode and the light emitting layer in addition to the electron transport layer. The light emitting layer and the electron transport layer may be one layer made of materials capable of serving their functions.

When a DC voltage is applied between the lower electrode 32 and the upper electrode 33, holes injected from the anode side reach the light emitting layer through the hole transport layer, while electrons injected from the cathode side reach the light emitting layer through the electron transport layer, and thus the electrons and the holes are recombined. With the recombination of the electrons and the holes, the organic light-emitting diode 30 emits light having a predetermined wavelength. In order to efficiently utilize light emitted from the light emitting layer, the lower electrode 32 is preferably made of a material having a high light reflectance. The lower electrode 32 maybe configured by laminating a transparent conductive film made of a material such as indium tin oxide (ITO) and a reflective film made of a material such as silver.

The seal 40 is formed so as to cover the upper electrode 33. The seal 40 preferably has high gas barrier property so as to protect the organic light-emitting diode 30 from water, for example, and is transparent to visible light. For example, a dense inorganic layer, such as silicon oxide, or a laminated film of an inorganic layer and an organic layer may be used as the seal 40. The counter substrate 60 is formed on the seal 40 through the transparent filler 50 made of a polymeric material.

The counter substrate 60 includes a color filter 61, a black matrix BM disposed around the color filter 61, and a transparent substrate 62 disposed on the color filter 61. Although a glass substrate is used as the substrate 10, it is not limited thereto and any substrate having insulation properties, such as a resin substrate, may be used.

Figure 2:
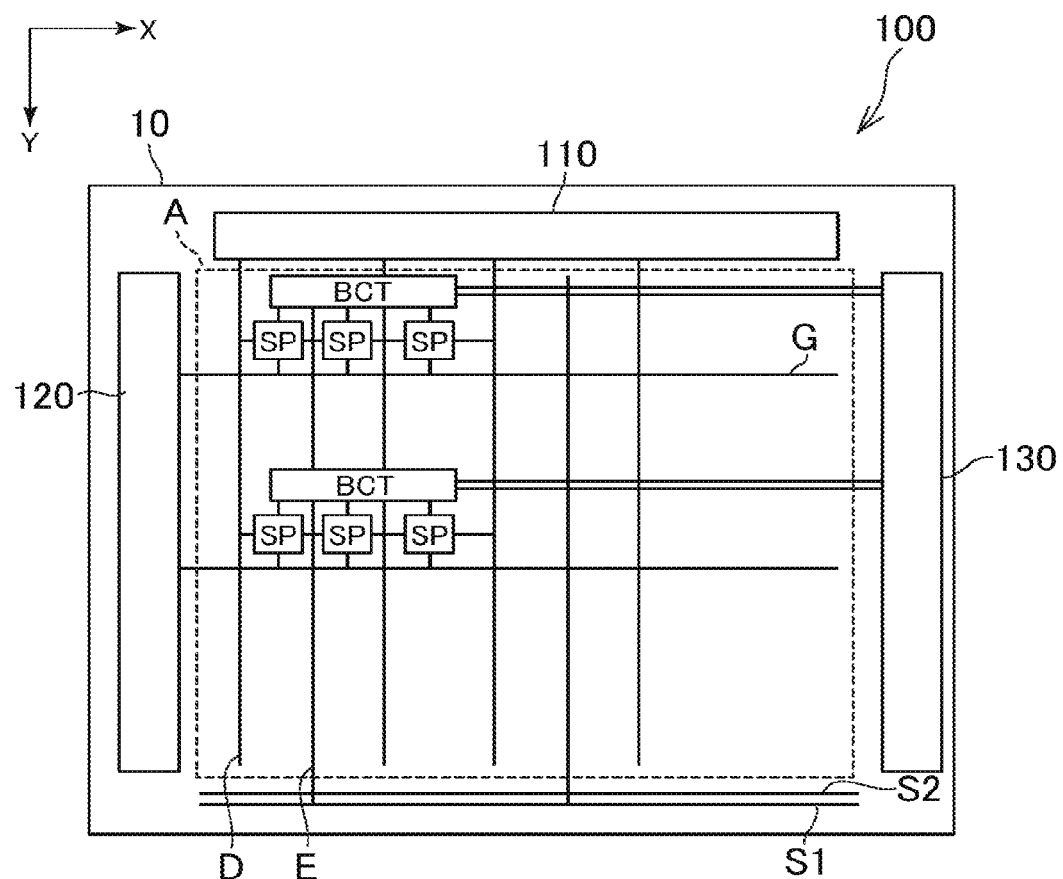
FIG. 2 is a schematic view illustrating a wiring structure of the display device according to the first embodiment.
Figure 3:
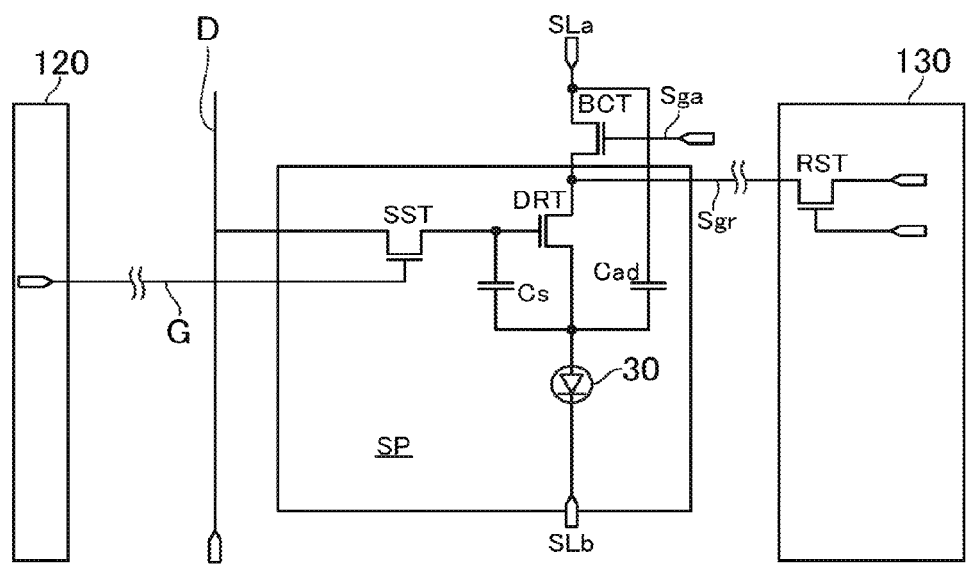
FIG. 3 is a diagram of an equivalent circuit per sub-pixel of an active matrix constituting the display device according to the first embodiment.

Next, referring to FIGS. 2 and 3, an outline of a circuit configuration of the display device according to the first embodiment will be discussed. FIG. 2 is a schematic view illustrating a wiring structure of the display device according to the first embodiment. FIG. 3 is a diagram illustrating an equivalent circuit per sub-pixel of an active matrix constituting sub-pixels of the display device according to the first embodiment.

In FIG. 2, a region surrounded by dashed lines on the substrate 10 indicates a display area A, which displays an image. On the display area A, a plurality of sub-pixels SP are disposed in a matrix. As shown in FIG. 2, a data driving circuit 110 that outputs an image signal to a data line D, a scan driving circuit 120 that outputs a scanning signal to a gate line G, and an output driving circuit 130 that drives an output switch transistor BCT are disposed around the display area A. The output driving circuit 130 includes a reset switch transistor RST (see FIG. 3) that is used common to the sub-pixels SP arranged in X-direction in FIG. 2. As described in details later, as shown in FIG. 2, the output switch transistor BCT is provided so as to be used common to three sub-pixels SP adjacent to each other in the X-direction.

As shown in FIG. 3, each sub-pixel SP includes a pixel switch transistor SST, an organic light-emitting diode 30, a storage capacitor Cs, a pixel capacitor Cad, and a driver transistor DRT. The storage capacitor Cs and the pixel capacitor Cad are condensers. The pixel capacitor Cad is an element for controlling a light emission current amount, and is not needed in some cases. In the pixel switch transistor SST, the gate electrode is connected to the gate line G, one of the source/drain electrodes is connected to the data line D, and the other one of the source/drain electrodes is connected to the storage capacitor Cs. In the driver transistor DRT, the gate electrode is connected to the storage capacitor Cs, the source electrode is connected to a potential wiring E (see FIG. 2) through the output switch transistor BCT, and the drain electrode is connected to one of electrodes of the organic light-emitting diode 30. Further, the other one of the electrodes of the organic light-emitting diode 30 is connected to current supply lines S1 and S2 (see FIG. 2), which are used common to all sub-pixels SP, and is held at a predetermined potential. The pixel switch transistor SST, the driver transistor DRT, the output switch transistor BCT, and the reset switch transistor RST are formed by the same conductivity type thin-film transistors, such as n-channel type thin-film transistors.

In the pixel circuit of the sub-pixel SP shown in FIG. 3, the driver transistor DRT and the output switch transistor BCT are connected to the organic light-emitting diode 30 in series between a high-potential power supply line SLa (also simply referred to as power supply line) and a low-potential power supply line SLb (also simply referred to as power supply line), and the gate electrode is connected to a scanning line Sga. The driver transistor DRT includes a source electrode connected to the organic light-emitting diode 30, a drain electrode connected to a reset wiring Sgr, and a gate electrode. The output switch transistor BCT switches drain electrodes of the high-potential power supply line SLa and the driver transistor DRT to a conducting state or a non-conducting state.

The pixel switch transistor SST is connected the data line D and the gate electrodes of the driver transistor DRT, and switches whether to capture a video signal Vsig, which is transmitted through the data line D, into the gate electrode of the driver transistor DRT. The captured signal is stored in the storage capacitor Cs.

The three adjacent sub-pixels SP in the X-direction share the output switch transistor BCT (see FIG. 2). This enables to reduce to one third of the number of the output switch transistor BCT and reduce light-shielded area, compared to a case where each sub-pixel SP is provided with an output switch transistor BCT, and thus it is possible to provide a display device having higher transparency.

When a display is performed with a known driving method in the sub-pixel circuit configuration described above, an output current given to the organic light-emitting diode has a value that does not depend on a threshold voltage of the driver transistor DRT. Further, the effect of the mobility of the driver transistor DRT can be compensated. As such, display defect caused by characteristic variance in the driver transistor DRT, streak-like irregularities, and roughness are prevented, and high-quality image display is enabled with three or less number of transistors per sub-pixel. In this case, the smaller number of transistors can reduce an area shielded from light by the transistors and the surrounding wiring, and thus it is possible to provide a display device having higher transparency.

Figure 4:
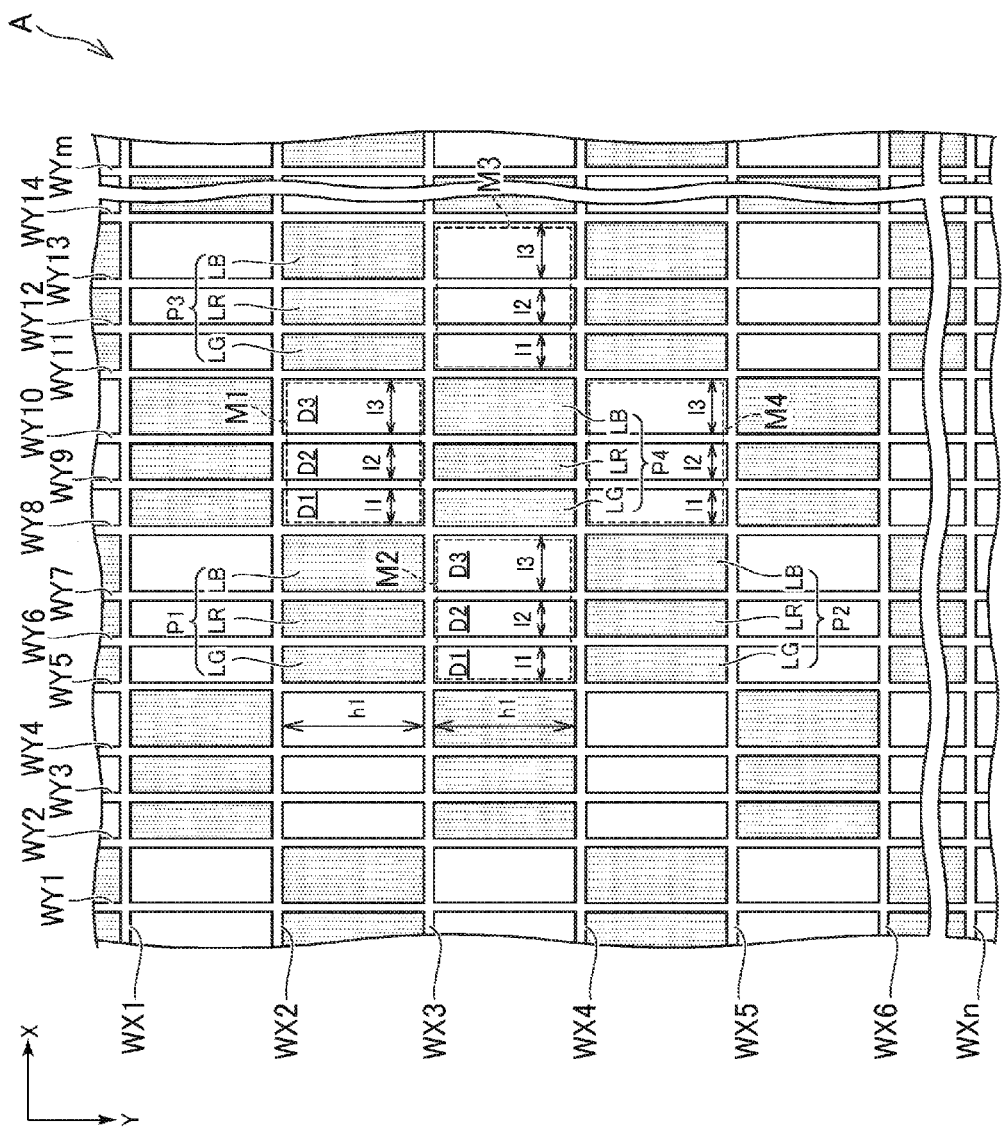
FIG. 4 is a schematic view of a light-emitting region and a light-transmitting region in the display device according to the first embodiment.

FIG. 4 is a schematic view of the light-emitting region and the light-transmitting region in the display device according to the first embodiment. The display device 100 includes a light-emitting region L and a light-transmitting region M on the display area A. In a case where light-emitting regions need to be distinguished, a light-emitting region is described with, for example, an alphabet letter (G, R, B) indicating a color in addition to "L" indicating a light-emitting region. In a case where light-emitting regions do not need to be distinguished, a light-emitting region is simply described as a light-emitting region L. Similarly, pixels P, light-transmitting regions M, wirings W, and divided regions D are described with numbers as appropriate only when these elements need to be distinguished.

Figure 6:
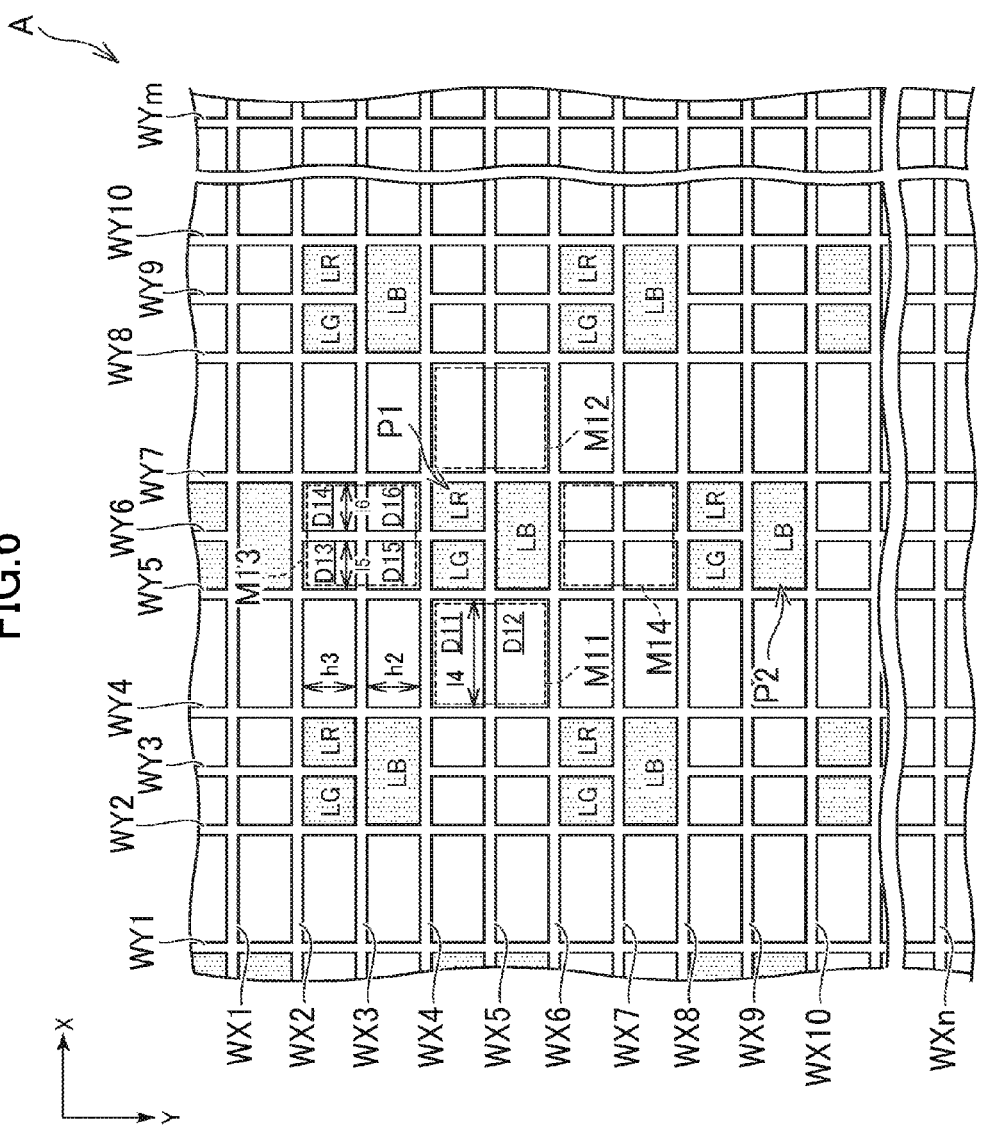
FIG. 6 is a schematic view of light-emitting regions and light-transmitting regions of the display device according to the second embodiment.

A pixel P is formed of a plurality of light-emitting regions L having at least three luminescent colors. In the first embodiment, as shown in FIG. 4, a pixel P is formed of three-color light-emitting regions divided into a light-emitting region LG having green luminescent color, a light-emitting region LR having red luminescent color, and a light-emitting region LB having blue luminescent color. The light-emitting regions LG, LR, and LB are regions in which sub-pixels SP (see FIG. 2) respectively disposed in corresponding light-emitting regions are controlled in brightness and emit light. In FIG. 4, a reference sign SP indicating a sub-pixel is omitted. Similarly, the reference sign SP is omitted in FIG. 6 illustrating the second embodiment.

The first embodiment employs a color filter method in which all light-emitting regions L emit the same color (e.g., white), and only light having a predetermined wavelength transmits each light-emitting region L through a color filter 61 provided in a counter substrate 60, but not limited to this. The present embodiments may employ a color-separation method for splitting the organic EL layer 31 to emit light of colors according to luminescent colors of the respective light-emitting regions L.

The light-emitting region L is a region divided by wirings W, and has sub-pixels SP arranged therein. The light-transmitting region M is an opening region divided by wirings W, and allows an object beyond the display area A to be seen through. The wirings W shown in FIG. 4 are, for example, the gate line G and the data line D described by referring to FIGS. 2 and 3, although any type of wiring may be used. As such, a wiring extending in the X-direction (first direction) is described as a wiring WX (first wiring), and a wiring extending in the Y-direction (second direction) intersecting the X-direction is described as a wiring WY (second wiring). As shown in FIG. 4, n wirings WX (n is an integer) are arranged in the Y-direction, and m wirings WY (m is an integer) are arranged in the X-direction.

In the first embodiment, a pixel P is formed of a light-emitting region LG having green luminescent color, a light-emitting region LR having red luminescent color, and a light-emitting region LB having blue luminescent color. The light-emitting regions LG, LR, and LB are disposed adjacent to one another in the X-direction. Specifically, the light-emitting region LR is disposed adjacent to the light-emitting region LG in the X-direction, and the light-emitting region LB is disposed adjacent to the light-emitting region LR in the X-direction.

The pixels P and the light-transmitting regions M are alternately arranged such that one light-transmitting region M is disposed between two pixels P closest to each other in the X-direction, one pixel P is disposed between two light-transmitting regions M closest to each other in the X-direction, one light-transmitting region M is disposed between two pixels P closest to each other in the Y-direction, and one pixel P is disposed between two light-transmitting region M closest to each other in the Y-direction. For example, as shown in FIG. 4, a light-transmitting region M1 is disposed between a pixel P1 and a pixel P3, which are two pixels closest to each other in the X-direction, and a pixel P4 is disposed between a light-transmitting region M2 and a light-transmitting region M3, which are two light-transmitting regions M closest to each other in the X-direction. Further, the light-transmitting region M2 is disposed between the pixel P1 and the pixel P2, which are two pixels closest to each other in the Y-direction, and the pixel P4 is disposed between the light-transmitting region M1 and the light-transmitting region M4, which are two light-transmitting regions closest to each other in the Y-direction. With this arrangement, the pixels P are arranged in a staggered pattern respectively in the X-direction and the Y-direction, and the light-transmitting regions M are arranged in a staggered pattern respectively in the X-direction and the Y-direction.

The light-transmitting regions M are divided into divided regions D with at least one of the wirings WX and the wirings WY. The light-transmitting regions M can also be divided into divided regions D with at least one of the wirings WX or at least one of the wirings WY. Specifically, for example, the light-transmitting region M1 is divided into three divided regions D1 to D3, which are adjacent to one another in the X-direction, by the wiring WY9 and the wiring WY10. Similarly, each of other light-transmitting regions M is divided into three divided regions D1 to D3 adjacent to one another in the X-direction by two wirings WY.

Here, in the light-transmitting regions M, there is a case where diffraction of light is caused by influence of edges of the wirings WX and WY. In particular, when regions are divided by the wirings WX and WY at regular intervals, that is, when the wirings WX and WY are arranged with a constant period (integral multiple), strong diffraction of light occurs. When the strong diffraction of light occurs, the light is scattered and the transparency is reduced, and thus an object that is seen through the display device appears blurred to the human eye. In the first embodiment, the light-transmitting regions M are divided into divided regions D of different widths so that different periods are mixedly used.

Specifically, when the width of the divided region D1 (first region) in the X-direction is l1, the width of the divided region D2 (first region) in the X-direction is l2, and the width of the divided region D3 (second region) in the X-direction is l3, l1=l2<l3. The divided regions D in other light-transmitting regions M, such as the light-transmitting regions M2 and M3, are constructed in a similar way. In this way, it is possible to prevent the diffraction of light from being strong by differentiating the width of l3 from the width of l1 and the width of l2. This is not limited thereto. For example, it is possible to further prevent the diffraction of light from being strong by differentiating the width of l1 from the width of l2. In the present embodiment, l3 is greater than 1 times l1 and l2, and less than two times l1 and l2 so that l3 is not an integral multiple of l1 and l2.

As shown in FIG. 4, in the first embodiment, divided regions D have the same width h1 in the Y-direction. However, this is not limited thereto. For example, it is possible to further prevent the diffraction of light from being strong by differentiating the width of the divided region D in the light-transmitting region M1 in the Y-direction from the width of the divided region D in the light-transmitting region M2 in the Y-direction.

The light-transmitting region M needs to allow an object beyond the display area A to be seen through. As such, some consideration is preferably needed regarding the arrangement of the transistors so that a transistor provided on each sub-pixel SP avoids projecting from the light-emitting region L and being provided on the light-transmitting region M.

In the first embodiment, as shown in FIG. 2, an output switch transistor BCT is used common to three sub-pixels SP. Specifically, the output switch transistor BCT is configured to be used common to sub-pixels SP that respectively correspond to the light-emitting region LG, the light-emitting region LR, and the light-emitting region LB. In other words, in the first embodiment, the output switch transistor BCT is used common to light-emitting regions L corresponding to all sub-pixels SP forming one pixel P. This configuration enables to reduce the number of transistors provided in one pixel P, thereby placing the transistors within the light-emitting region L and ensuring the transparency of the light-transmitting region M. The transistor is not limited to be used common to three sub-pixels, but may be used common to two sub-pixels.

As described above, in the first embodiment, the divided regions D having the widths different from one another in the X-direction are provided. This configuration prevents the diffraction of light from being strong, and enhances transparency of the light-transmitting region M. Further, the output switch transistor BCT is used common to three sub-pixels SP, and thus the transistors are placed within the light-emitting region L and the transparency of the light-transmitting region M is ensured.

Figure 5:
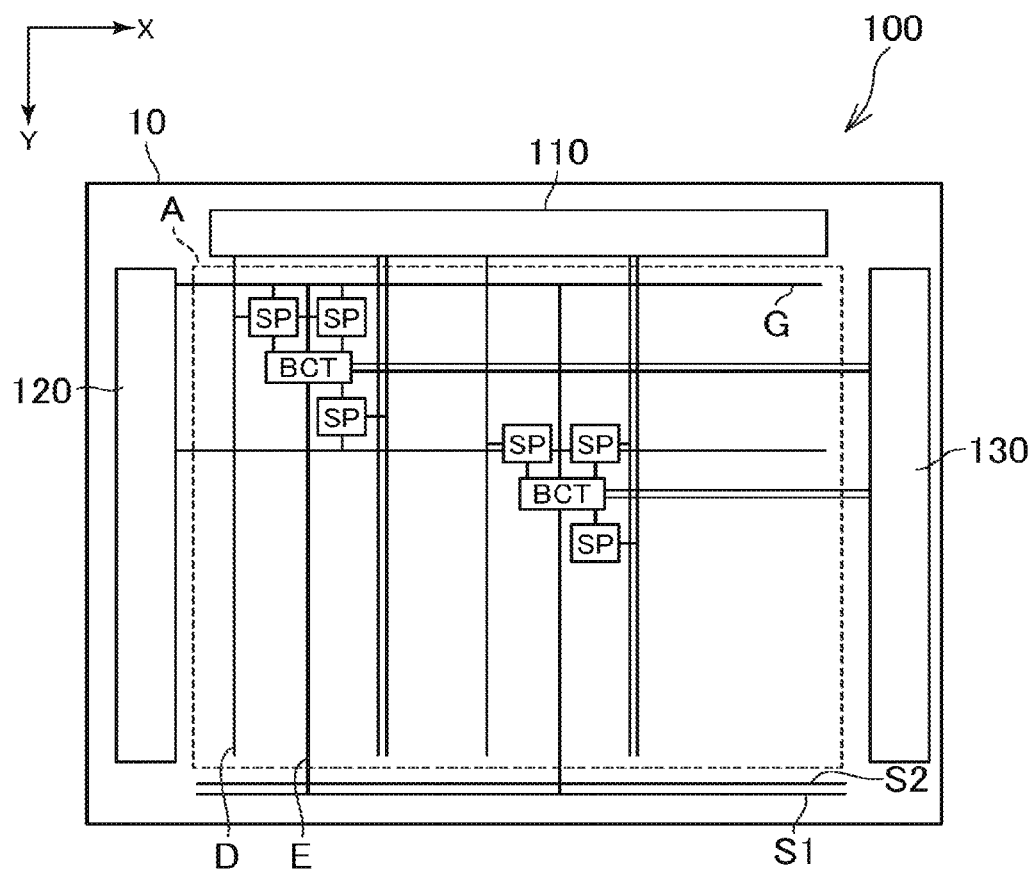
FIG. 5 is a schematic view illustrating a wiring structure of the display device according to the second embodiment.

Next, referring to FIGS. 5 and 6, the display device 100 according to second embodiment will be described. FIG. 5 is a schematic view illustrating a wiring structure of the display device according to the second embodiment. FIG. 6 is a schematic view of light-emitting regions and light-transmitting regions of the display device according to the second embodiment. As for the same components as those of the first embodiment, description will be omitted.

As shown in FIG. 6, in the second embodiment, one pixel P is formed of three light-emitting regions LG, LR, and LB divided in three colors. Specifically, one pixel P is formed of a light-emitting region LG having green luminescent color and a light-emitting region LR having red luminescent color, which are a pair of light-emitting regions adjacent to each other in the X-direction, and a light-emitting region LB having blue luminescent color, which is adjacent to both of the light-emitting regions LG and LR in the Y-direction.

In the second embodiment, similarly to the first embodiment, the pixels P are arranged in a staggered pattern respectively in the X-direction and the Y-direction in the display area A. Further, light-transmitting regions M are disposed in respective sides of a pixel P so as to be adjacent to the pixel P in the X-direction and in the Y-direction.

For example, as shown in FIG. 6, the light-transmitting region M11 and the light-transmitting region M12 are disposed in respective sides of the pixel P1 in the X-direction so as to be adjacent to the pixel P1, and the light-transmitting region M13 and the light-transmitting region M14 are disposed in respective sides of the pixel P1 in the Y-direction so as to be adjacent to the pixel P2.

For example, the light-transmitting region M11 is divided into two divided regions D11 and D12, which are adjacent to each other in the Y-direction, by the wiring WX5. Other light-transmitting regions M adjacent to one another in the X-direction of pixels P, such as the light-transmitting region M12, are configured in the same way as the light-transmitting region M11.

For example, the light-transmitting region M13 is divided by a wiring WX3 and a wiring WY6 into four divided regions, which are a divided region D13 and a divided region D14 adjacent to each other in the X-direction and a divided region D15 and a divided region D16 adjacent to each other in the X-direction so as to be adjacent to the divided regions D13 and D14 in the Y-direction. Other light-transmitting regions M adjacent to one another in the Y-direction of pixels P, such as the light-transmitting region M14, are configured in the same way as the light-transmitting region M13.

When the width of the divided region D11 in the X-direction is l4, the width of the divided region D15 in the X-direction is l5, and the width of the divided region D16 in the X-direction is l6, l4>l5=l6. In this way, it is possible to prevent the diffraction of light from being strong by differentiating l5 and l6 from l4. This is not limited thereto. For example, it is possible to further prevent the diffraction of light from being strong by differentiating l5 from l6. In the second embodiment, l4 is greater than twice l5 and l6, and less than three times l5 and l6 so that l4 is not an integral multiple of l5 and l6.

In the second embodiment, similarly to the first embodiment, the output switch transistor BCT is used common to a plurality of sub-pixels SP. Specifically, the output switch transistor BCT is used common to three sub-pixels SP that respectively correspond to the light-emitting region LG, the light-emitting region LR, and the light-emitting region LB. In other words, in the second embodiment, the output switch transistor BCT is used common to light-emitting regions L that correspond to all sub-pixels SP forming one pixel P. This configuration reduces the number of transistors provided in one pixel P, thereby placing the transistors within the light-emitting regions L and ensuring transparency of the light-transmitting regions M.

As described above, in the second embodiment, the light-transmitting regions M are disposed adjacent to one another in respective sides of the pixels P in the X-direction and the Y-direction. This configuration increases a ratio of the light-transmitting regions M in the display area A, and thus enhances transparency. Further, the divided regions D, which are different from one another in widths in the X-direction, are provided, and thus it is possible to further prevent the diffraction of light from being strong and enhance the transparency of the light-transmitting regions M. Further, the output switch transistor BCT is used common to three sub-pixels SP. This configuration enables to place the transistors within the light-emitting region L and widen the light-transmitting regions M, thereby ensuring the higher transparency of the light-transmitting regions M.

In one pixel P, combinations and arrangements of colors of light-emitting regions L are not limited to examples shown in FIGS. 4 and 6, and may include at least a light-emitting region L in a color having high visibility. The color having the highest visibility among green, red, and blue is green, and each pixel P described in the first embodiment includes a light-emitting region L having green luminescent color. In this regard, the visibility indicates a degree to which a person feels brightness, and light having about 550 nm wavelength is known to have high visibility. As shown in FIGS. 4 and 6, a ratio of a blue light-emitting region LB in one pixel P is preferably greater than ratios of green light-emitting region LG and red light-emitting region LR in the pixel P. This approach is effective for reducing power consumption, because typically, luminous efficacy of blue is significantly lower than that of green and red in the current organic electroluminescence.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A display device comprising:
   a plurality of pixels each including light-emitting regions, colors of the light-emitting regions being different from each other;
   a plurality of light-transmitting regions;
   a plurality of first wirings extending in a first direction; and
   a plurality of second wirings extending in a second direction that intersects the first direction, wherein
   the pixels and the light-transmitting regions are alternately disposed such that at least one of the light-transmitting regions is disposed between two of the pixels which are adjacent to each other in the first direction and at least one of the light-transmitting regions is disposed between two of the pixels which are adjacent to each other in the second direction,
   each of the light-transmitting regions is divided into a plurality of divided regions by at least one of the first wirings and the second wirings,
   the divided regions include a first region with a first width and a second region with a second width which is a same direction of the first width,
   the same direction is one of the first and second direction,
   a value of the first width is different from a value of the second width.
2. The display device according to claim 1, wherein
   the pixels are disposed in a staggered pattern respectively in the first direction and the second direction, and
   the light-transmitting regions are disposed in a staggered pattern respectively in the first direction and the second direction.
3. The display device according to claim 2,
   the pixels and the light-transmitting regions are alternately disposed such that one of the light-transmitting regions is disposed between the two of the pixels which are adjacent to each other in the first direction, one of the pixels is disposed between two of the light-transmitting regions which are adjacent to each other in the first direction, one of the light-transmitting regions is disposed between the two of the pixels which are adjacent to each other in the second direction, and one of the pixels is disposed between two of the light-transmitting regions which are adjacent to each other in the second direction.
4. The display device according to claim 1, wherein
   the light-emitting regions are arranged in the first direction, and
   the divided regions are adjacent to one another in the first direction.
5. The display device according to claim 1, wherein
   the pixels are disposed in a staggered pattern respectively in the first direction and the second direction, and
   a first group of the light-transmitting regions are disposed at both sides of each of the pixels in the first direction, a second group of the light-transmitting regions are disposed at both sides of each of the pixels in the second direction.

6. The display device according to claim 5, wherein the light-emitting regions include a pair of light-emitting regions adjacent to each other in the first direction, and one light-emitting region adjacent to the pair of light-emitting regions in the second direction.

7. The display device according to claim 5, wherein each of the first group are divided into the divided regions adjacent to one another in the second direction.

8. The display device according to claim 5, wherein each of the second group are divided into the divided regions adjacent to one another in both of the first direction and the second direction.

9. The display device according to claim 1, wherein each of the pixels includes a plurality of sub pixels and a plurality of transistors,
each of sub pixels includes each of the light-emitting regions,
the transistors in one of the pixels include a transistor that is connected to all of the sub pixels in the one of the pixels.

10. The display device according to claim 1, wherein each of the light-transmitting regions is divided into a plurality of divided regions by at least one of the first wirings.

11. The display device according to claim 1, wherein each of the light-transmitting regions is divided into a plurality of divided regions by at least one of the second wirings.

12. A display device comprising:
a first pixel, a second pixel, and a third pixel, each including a plurality of sub-pixels; and
a first light-transmitting region, a second light-transmitting region, and a third light-transmitting region through which light is transmitted, wherein
the first pixel, the first light-transmitting region, and the second pixel are disposed in a first direction in this order,
the second light-transmitting region, the third pixel, and the third light-transmitting region are disposed in the first direction in this order,
the first pixel and the second light-transmitting region are disposed in a second direction that intersects the first direction,
a plurality of wirings extending in the second direction,
each of the first to third light-transmitting regions is divided into a plurality of divided regions including at least a first divided region and a second divided region by the wirings,
the first divided region has a first width in the first direction,
the second divided region has a second width in the first direction, and
a value of the first width is different from a value of the second width.

13. The display device according to claim 12, wherein the wirings include at least one of a data line and a power supply line.

14. The display device according to claim 12, wherein the sub-pixels include a first sub-pixel, a second sub-pixel, and a third sub-pixel which are adjacent to one another in the first direction,
each of the first light-transmitting region, the second light-transmitting region, and the third light-transmitting region includes the first divided region and the second divided region, and a third divided region with the second width,
the first sub-pixel is adjacent to the first divided region in the second direction,
the second sub-pixel is adjacent to the second divided region in the second direction, and
the third sub-pixel is adjacent to the third divided region in the second direction.

15. The display device according to claim 12, further comprising:
a fourth light-transmitting region that includes an area between the first pixel and the first light-transmitting region and an area between the second light-transmitting region and the third pixel and extends in the second direction;
a fifth light-transmitting region that includes an area between the second pixel and the first light-transmitting region and an area between the third light-transmitting region and the third pixel and extends in the second direction; and
a plurality of second wirings that extend in the first direction, wherein
both the fourth light-transmitting region and the fifth light-transmitting region is divided into a plurality of divided regions by the second wirings.

16. The display device according to claim 15, wherein the sub-pixels include the first sub-pixel and the second sub-pixel adjacent to each other in the first direction, and the third sub-pixel adjacent to both the first sub-pixel and the second sub-pixel in the second direction.

17. A display device comprising:
a first pixel, a second pixel, and a third pixel, each including a plurality of sub-pixels;
a first light-transmitting region, a second light-transmitting region, a third light-transmitting region, a fourth light-transmitting region, and a fifth light-transmitting region through which light is transmitted;
a plurality of first wirings extending in a second direction; and
a plurality of second wirings extending in a first direction that intersects the second direction, wherein
the first pixel, the first light-transmitting region, and the second pixel are disposed in the first direction in this order,
the second light-transmitting region, the third pixel, and the third light-transmitting region are disposed in the first direction in this order,
the first pixel and the second light-transmitting region are disposed in the second direction,
the first light-transmitting region and the third pixel are disposed in the second direction,
the second pixel and the third light-transmitting region are disposed in the second direction,
the fourth light-transmitting region includes an area between the first pixel and the first light-transmitting region and an area between the second light-transmitting region and the third pixel and extends in the second direction,
the fifth light-transmitting region includes an area between the second pixel and the first light-transmitting region and an area between the third light-transmitting region and the third pixel and extends in the second direction,
each of the first to third light-transmitting regions is divided into a plurality of fourth divided regions by the first wirings, both the fourth light-transmitting region and the fifth light-transmitting region is divided into a plurality of fifth divided regions by the second wirings,
one of the fourth divided region has a fourth width in the first direction,
one of the fifth divided region has a fifth width in the first direction, and
a value of the fourth width is different from a value of the fifth width.

18. The display device according to claim 17,
the sub-pixels include a first sub-pixel and a second sub-pixel adjacent to each other in the first direction, and a third sub-pixel adjacent to both the first sub-pixel and the second sub-pixel in the second direction.

\* \* \* \* \*